United States Patent
Chan et al.

(10) Patent No.: US 7,342,813 B1
(45) Date of Patent: Mar. 11, 2008

(54) HALF BRIDGE INVERTER WITH DUAL N-MOS

(75) Inventors: Chun-Kong Chan, Hsi Chih (TW); Jeng-Shong Wang, Hsin Chuang (TW)

(73) Assignee: Lien Chang Electronic Enterprise Co., Ltd., Taipei County (TW)

( * ) Notice: Subject to any disclaimer, the term of this patent is extended or adjusted under 35 U.S.C. 154(b) by 0 days.

(21) Appl. No.: 11/504,604

(22) Filed: Aug. 16, 2006

(51) Int. Cl.
*H02M 7/5387* (2007.01)
*H02M 7/42* (2006.01)

(52) U.S. Cl. ..................................... 363/132
(58) Field of Classification Search ................. 363/95, 363/97, 98, 131, 132; 315/209, 219; 327/108

See application file for complete search history.

(56) References Cited

U.S. PATENT DOCUMENTS 5,959,850 A * 9/1999 Lim ........................... 363/17

* cited by examiner

*Primary Examiner*—Gary L Laxton
(74) *Attorney, Agent, or Firm*—Rosenberg, Klein & Lee

(57) ABSTRACT

A half bridge inverter with dual N-MOS includes a push/pull control chip outputting a first control signal with a duty cycle greater than 50% and a second control signal with a duty cycle greater than 50%. Moreover, both a first buffer circuit and a second buffer circuit are coupled to the push/pull control chip. A driver couples to the push/pull control chip through the first buffer circuit for receiving the first control signal, and couples to a DC power. A half bridge switch assembly with two N-MOSes couples to the DC power, the driver, the second buffer circuit and a transformer, and converts the DC power into an AC power by the driver. The AC power is transmitted to a first side of the transformer.

15 Claims, 11 Drawing Sheets

HALF BRIDGE INVERTER WITH DUAL N-MOS

BACKGROUND OF THE INVENTION

1. Field of the Invention

The present invention relates to a half bridge inverter with dual N-MOS and, more particularly, to a half bridge inverter controlled by a push/pull control chip to drive a load.

2. Description of Related Art

The power supply for a backlight source of a TFT LCD panel makes use of an inverter circuit to accomplish energy conversion and turn a cold cathode fluorescent lamp (CCFL) on. Conventional inverter circuits can be divided into half bridge-type, full-bridge type and push/pull-type according to different circuit topologies. An inverter circuit is a circuit for converting DC power into AC power.

As shown in FIG. 1, a transformer T1 divides the circuit into a front-end circuit at the first side 101 and a rear-end circuit at the second side 102. The front-end circuit at the first side 101 comprises a DC voltage source Vcc, a first switch Q1, and a second switch Q2. The rear-end circuit at the second side 102 comprises at least a capacitor (C1, C2, C3), a load, and at least a diode (D1, D2). A push/pull control chip 103 is connected between the front-end circuit at the first side 101 and the rear-end circuit at the second side 102.

Reference is also made to FIG. 2 as well as FIG. 1. The push/pull control chip 103 outputs a first control signal a and a second control signal b to turn switching actions of the two switches Q1 and Q2 at the first side 101, respectively. A DC power Vcc is used to provide energy, and the transformer T1 raises and converts the voltage of DC power Vcc to the rear-end circuit 102 for driving the load. The output voltage waveform c at the second side of the transformer T1 is the voltage waveform at point C. As shown in FIG. 2, the output voltage waveform c at the second side is an AC voltage waveform.

In the above description, the push/pull control chip 103 can be the LX1686, LX1688 or LX1691 push/pull control chip produced by Linfinity (Microsemi) Corporation, or the 02-9RR, 0Z9930, 0Z9938 or 0Z9939 push/pull control chip produced by O2 Micro International Limited, or the TL-494 or TL594 push/pull control chip produced by TEXAS INSTRUMENT, or the BIT3193, BIT3713, BIT3715 or BIT3501 push/pull control chip produced by Beyond Innovation Technology.

As shown in FIG. 3, a transformer T2 divides the circuit into a front-end circuit at the first side 201 and a rear-end circuit at the second side 202. The front-end circuit at the first side 201 comprises a DC voltage source Vcc, two electronic switches (Q1, Q2), a half-bridge control chip TL494, two capacitors (C1, C2) and a drive transformer Tr. The rear-end circuit at the second side 202 comprises a load.

Reference is also made to FIG. 4 as well as FIG. 3. The half-bridge control chip TL494 outputs control signals D1-D2 via two output terminals D1 and D2. The control signals D1-D2 control switching actions of the two electronic switches Q1 and Q2 via the drive transformer Tr, respectively. The two electronic switches Q1 and Q2 are N-MOSes or P-MOSes. Through switching actions of the two electronic switches Q1 and Q2, electric energy stored in the capacitors C1 and C2 can be transferred to a first side terminal T21 of the transformer T2 via a coupling capacitor C3 to form an AC power ac. The voltage of the capacitors C1 and C2 is a half (Vcc/2) of the DC voltage Vcc. The AC power ac is used to provide energy for the transformer T2, which boosts the AC power to the second side 202 for driving the load.

In the above description, if the inverter circuit used is of the half bridge-type, a half-bridge control chip needs to be matched for normal operations, while if the used inverter circuit is of the push/pull-type, a push/pull control chip needs to be matched for normal operations, hence having less flexibility and commonality in practical use. Because of the above limitation, control chips can't be jointly used and purchased together, or a more complicated circuit needs to be matched.

Moreover, the conventional half bridge inverter circuit needs to use an isolation transformer to control the switching actions of electronic switches instead of directly driving electronic switches. Besides, the two electronic switches used by the conventional half bridge inverter circuit are both N-MOSes, both P-MOSes, or a P-MOS and an N-MOS.

SUMMARY OF THE INVENTION

Accordingly, an object of the present invention is to provide a half bridge inverter with dual N-MOS, in which a driver is connected between output terminals of a push/pull control chip and a half bridge switch assembly composed of two N-MOSes. The driver is controlled by the push/pull control chip to drive the switching actions of the half bridge switch assembly.

Another object of the present invention is to provide a half bridge inverter with dual N-MOS, in which a driver is connected between two electronic switches and a control chip of the conventional half bridge inverter. The control chip is replaced with a push/pull control chip outputting a first control signal with a duty cycle greater than 50% and a second control signal with a duty cycle smaller than 50% to control the switching actions of the two electronic switches separately.

The half bridge inverter with dual N-MOS of the present invention comprises a push/pull control chip, a switch, an SCR switch, a first N-MOS and a second N-MOS. The push/pull control chip has a first output terminal and a second output terminal, the first output terminal outputting a first control signal with a duty cycle greater than 50%, and the second output terminal outputting a second control signal with a duty cycle smaller than 50%. The switch couples to a reference terminal and to the first output terminal of the push/pull control chip. The SCR switch has a gate coupling to the switch and an anode coupling to the DC power. The first N-MOS has a gate coupling to a cathode of the SCR switch, a drain coupling to the DC power and a source coupling to the first side of the transformer. The second N-MOS has a gate coupling to the second output terminal of the push/pull control chip, a drain coupling to the source of the first N-MOS and a source coupling to the reference terminal.

The half bridge inverter with dual N-MOS of the present invention uses a driver in the conventional half bridge inverter circuit to match a push/pull control chip which outputs a first control signal with a duty cycle greater than 50% and a second control signal with a duty cycle smaller than 50% so as to drive the switching actions of the half bridge switch assembly. The present invention has higher flexibility in practical use, and won't be limited by the control chip. Moreover, manufacturers only need to use push/pull control chips to drive and control push/pull inverter circuits or half bridge inverter circuits.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
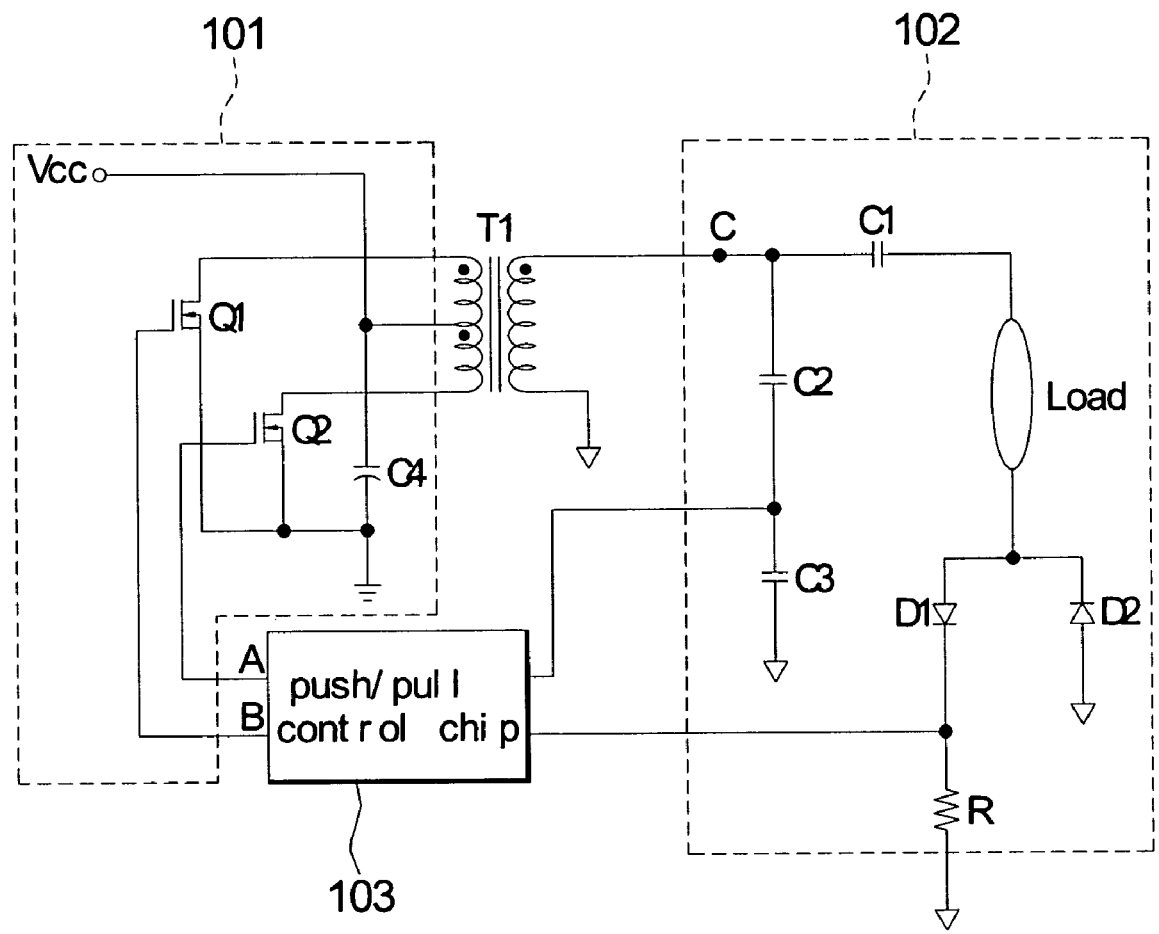
FIG. 1 is a circuit diagram of the push/pull inverter circuit that drives a load in the prior art.
Figure 2:
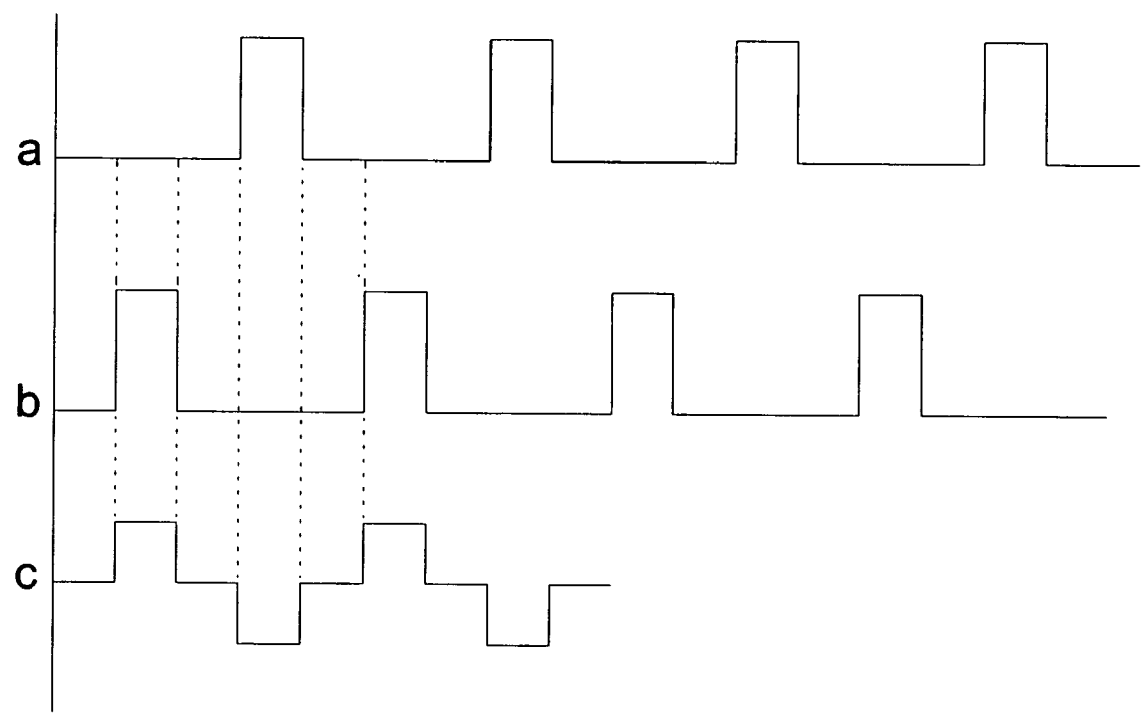
FIG. 2 is a waveform diagram of the control signals output by the push/pull control chip and the output voltage at the load in the prior art.
Figure 3:
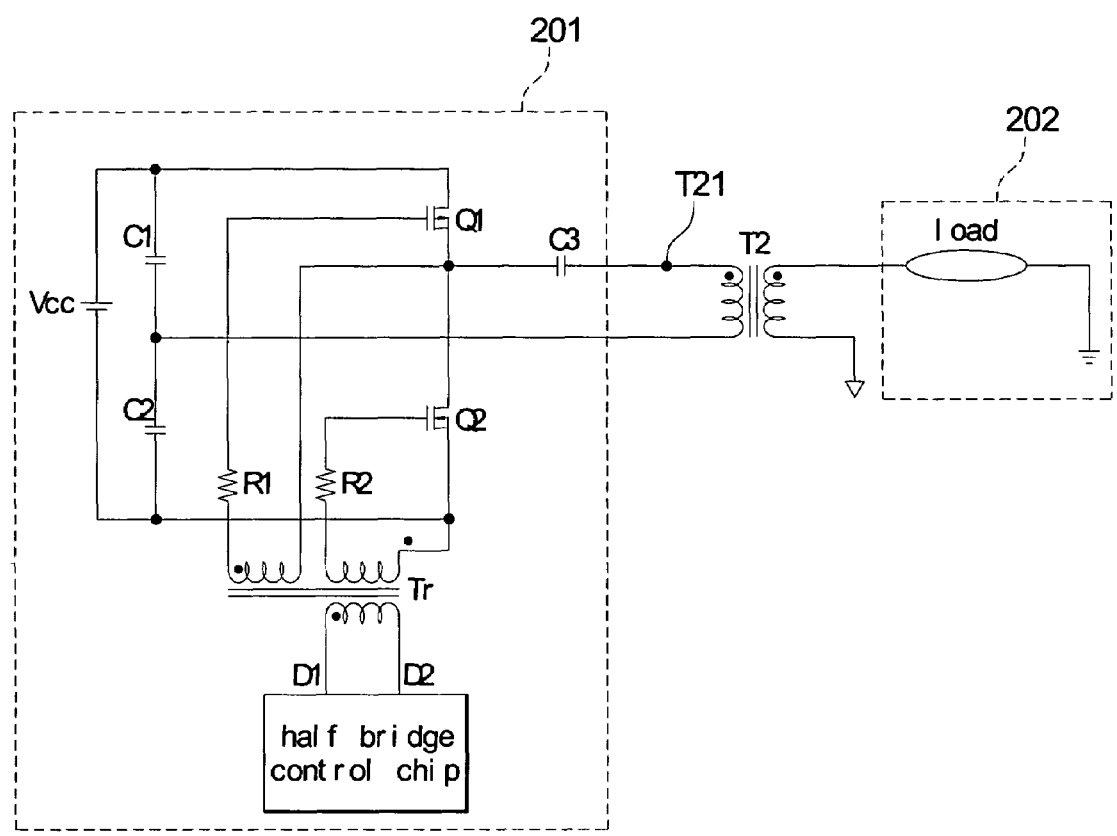
FIG. 3 is a circuit diagram of the half bridge inverter circuit that drives a load in the prior art.
Figure 4:
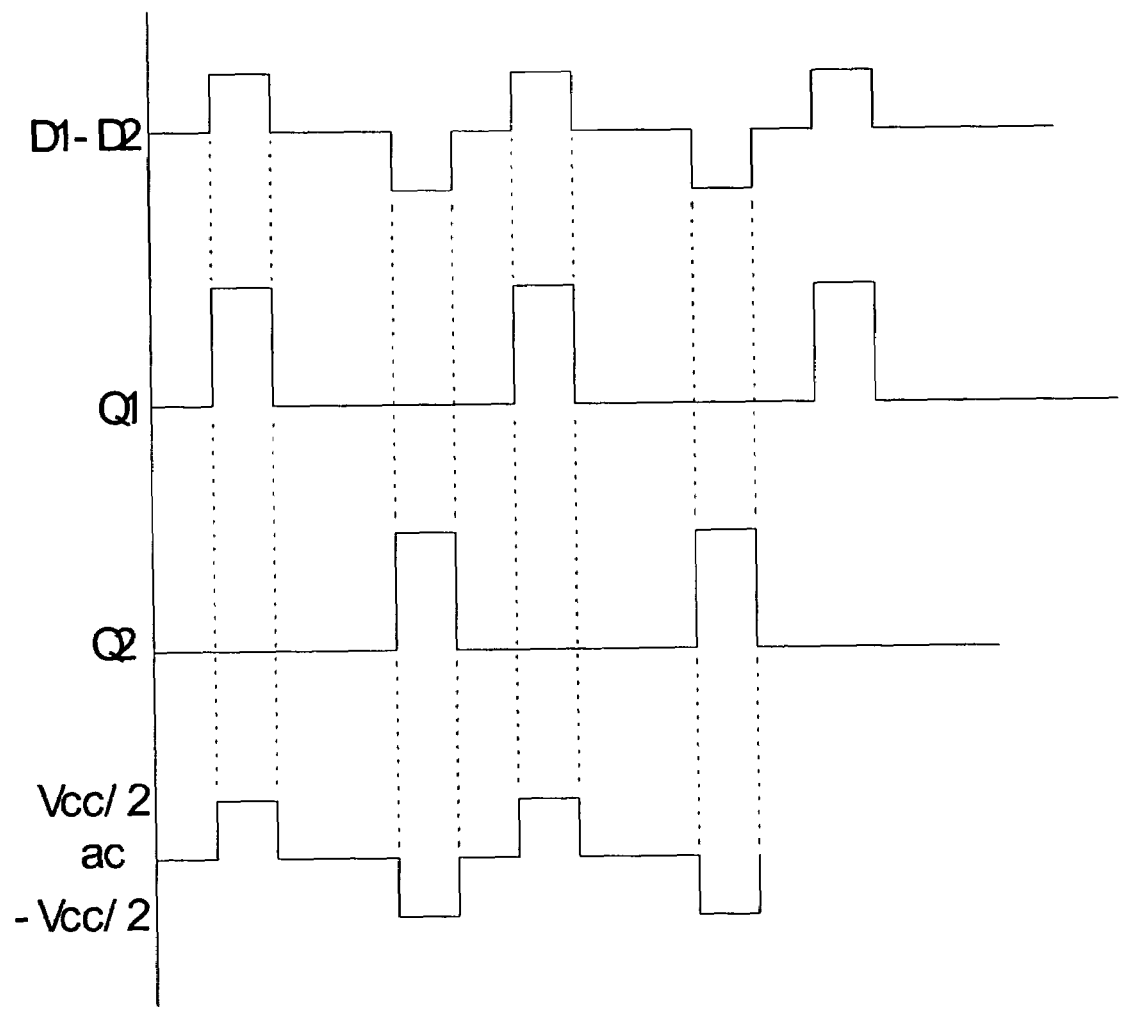
FIG. 4 is a waveform diagram of the control signals output by the half bridge control chip and the AC power voltage in the prior art.
Figure 5:
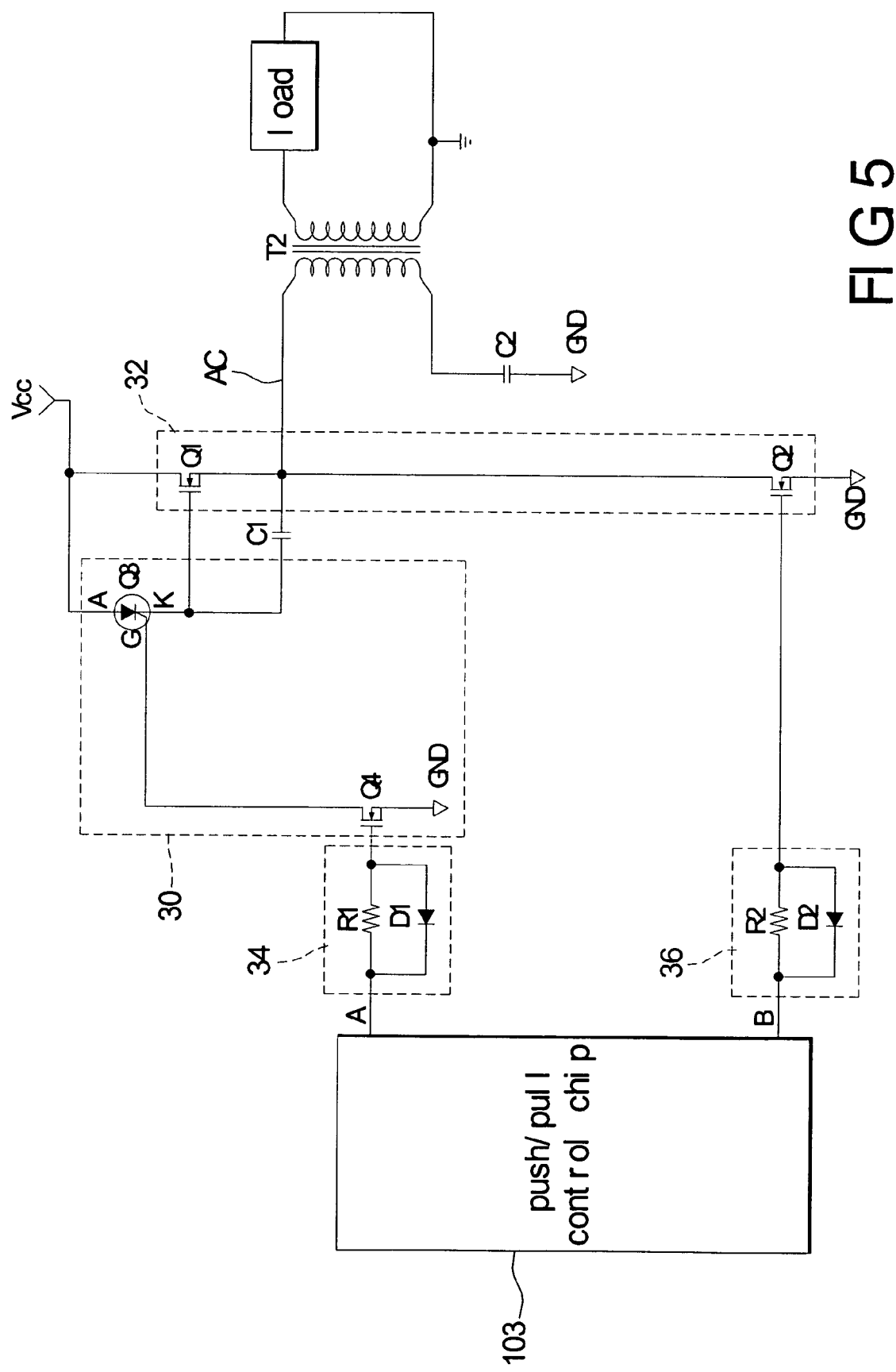
FIG. 5 is a circuit diagram of the half bridge inverter with dual N-MOS according to a first embodiment of the present invention.

As shown in FIG. 5, a half bridge inverter with dual N-MOS according to the first embodiment of the present invention is connected to a first side of a transformer T2 to convert a DC power Vcc to an AC power. The AC power provides electric energy required by the load via the transformer T2.

Reference is made to FIG. 5 again. The half bridge inverter with dual N-MOS according to the first embodiment of the present invention comprises a push/pull control chip 103, a first buffer circuit 34, a second buffer circuit 36, a driver 30 and a half bridge switch assembly 32. The push/pull control chip 103 has a first output terminal A and a second output terminal B, the first output terminal A outputting a first control signal a with a duty cycle greater than 50%, and the second output terminal B outputting a second control signal b with a duty cycle smaller than 50%. The first buffer circuit 34 couples to the first output terminal A of the push/pull control chip 103. The second buffer circuit 36 couples to the second output terminal B of the push/pull control chip 103. The driver 30 couples to the first output terminal A of the push/pull control chip 103 via the first buffer circuit 34 and to the DC power Vcc, and receives the first control signal a. The half bridge switch assembly 32 is composed of two N-MOSes. The half bridge switch assembly 32 couples to the DC power Vcc, the driver 30, the second buffer circuit 36 and the transformer T2. Matching with the action of a resonance capacitor C2 coupling to the first side of the transformer T2, the half bridge switch assembly 32 is controlled by the driver 30 to convert the DC power Vcc to the AC power. The AC power is transmitted to the first side of the transformer T2.

Reference is made to FIG. 5 again. The driver 30 comprises a switch Q4 and an SCR switch Q3. The switch Q4 couples to the first buffer circuit 34 and a reference terminal GND. The SCR switch Q3 has a gate coupling to the switch Q4, an anode (A) coupling to the DC power Vcc and a cathode (K) coupling to the half bridge switch assembly 32.

Reference is made to FIG. 5 again. The half bridge switch assembly 32 comprises a first N-MOS Q1 and a second N-MOS Q2. The gate of the first N-MOS Q1 couples to the cathode (K) of the SCR switch Q3. The drain of the first N-MOS Q1 couples to the DC power Vcc. The source of the first N-MOS Q1 couples to the first side of the transformer T2. The gate of the second N-MOS Q2 couples to the second output terminal B of the push/pull control chip 103 via the second buffer circuit 36. The drain of the second N-MOS Q2 couples to the source of the first N-MOS Q1. The source of the second N-MOS Q2 couples to the reference terminal GND. In the above description, the DC power Vcc provides a positive DC power +Vcc for the transformer T2 through conduction of the first N-MOS Q1 to form a positive half-cycle of driving, or provides a negative DC power −Vcc for the transformer T2 through conduction of the second N-MOS Q2 to form a negative half-cycle of driving.

Reference is made to FIG. 5 again. The first buffer circuit 34 comprises a first accelerating diode D1 and a first resistor R1. The negative terminal (N) of the first accelerating diode D1 couples to the first output terminal A of the push/pull control chip 103. The positive terminal (P) of the first accelerating diode D1 couples to the switch Q4. The first resistor R1 parallel couples to the first accelerating diode D1. The second buffer circuit 36 comprises a second accelerating diode D2 and a second resistor R2. The negative terminal (N) of the second accelerating diode D2 couples to the second output terminal B of the push/pull control chip 103. The positive terminal (P) of the second accelerating diode D2 couples to the gate of the second N-MOS Q2. The second resistor R2 parallel couples to the second accelerating diode D2.

Reference is made to FIG. 5 again. The half bridge inverter with dual N-MOS of the present invention further comprises a capacitor C1. The capacitor C1 is coupled between the gate and source of the first N-MOS Q1. The capacitor C1 can be added in the circuit in consideration of the requirement of circuit characteristics. In circuit design, the capacitor C1 can be replaced with a parasitic capacitor $C_{GS}$ between the gate and source of the first N-MOS Q1.

Figure 11:
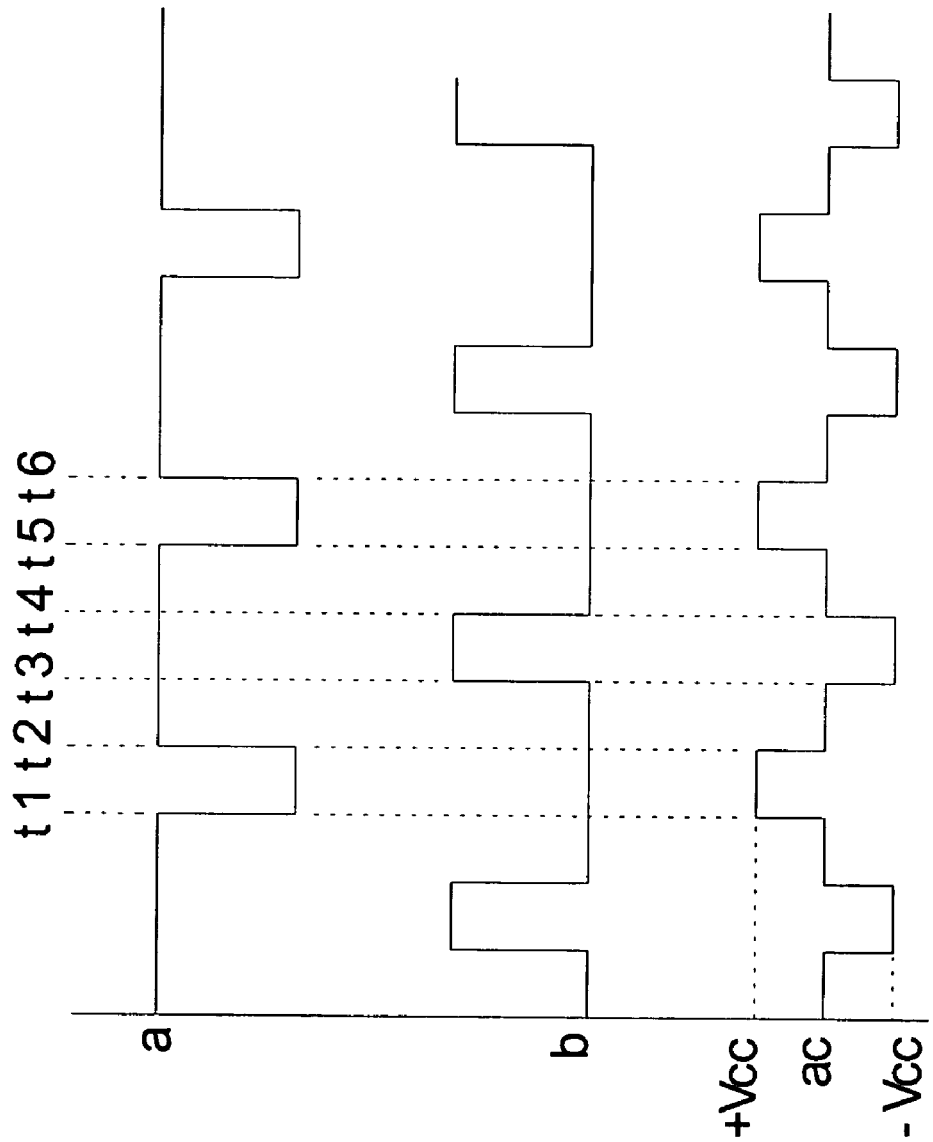
FIG. 11 is a waveform diagram of the output signals of the push/pull control chip and the AC power voltage of the present invention.

Reference is made to FIG. 11 as well as FIG. 5. The push/pull control chip 103 can be the LX1686, LX1688 or LX1691 push/pull control chip produced by Linfinity (Microsemi) Corporation, or the 02-9RR, 0Z9930, 0Z9938 or 0Z9939 push/pull control chip produced by O2 Micro International Limited, or the TL-494 or TL594 push/pull control chip produced by TEXAS INSTRUMENT, or the BIT3193, BIT3713, BIT3715 or BIT3501 push/pull control chip produced by Beyond Innovation Technology. Because there are so many brands in the market, only those in common use are listed above.

As shown in FIG. 11, the output terminal A of the push/pull control chip 103 outputs the first control signal a with a duty cycle greater than 50%, and the output terminal B of the push/pull control chip 103 outputs the second control signal b with a duty cycle smaller than 50%. A voltage waveform ac of the AC power can be obtained at the first side of the transformer T2 according to the switching action of the first N-MOS and the second N-MOS, and to the action of the resonance capacitor C2.

Reference is made to FIG. 11 as well as FIG. 5 again. At time $t_1$ to $t_2$, both the first control signal a and the second control signal b are at the low level. The first control signal a at the low level is transmitted to the control end of the switch Q4 via the first buffer circuit 34 to turn off the switch Q4. The switch Q4 that is kept off lets the gate (G) of the SCR switch Q3 be floating. At this time, the DC power Vcc will be between the anode (A) and the cathode (K) of the SCR switch Q3 to turn on the SCR switch Q3. Once the SCR switch Q3 is turned on, the DC power Vcc will turn on the first N-MOS Q1.

Besides, the second control signal b at the low level is transmitted to the gate of the second N-MOS Q2 via the second buffer circuit 36 to turn off the second N-MOS Q2. Therefore, at time $t_1$ to $t_2$, the first N-MOS Q1 is on, while the second N-MOS Q2 is off. At this time, because the first N-MOS Q1 is on, the DC power Vcc can transmit energy to the first side of the transformer T2 and the resonance capacitor C2. The voltage waveform ac obtained at the first side of the transformer T2 is a positive DC power +Vcc, and forms a positive half cycle of driving. At this time, a DC voltage will be built across two ends of the resonance capacitor C2.

Reference is made to FIG. 11 as well as FIG. 5 again. At time $t_2$ to $t_3$, the first control signal a rises from the low level to the high level, and the second control signal b still keeps at the low level. At this time, the first control signal a at the high level is transmitted to the switch Q4 via the first buffer circuit 34 to turn on the switch Q4. The switch Q4 that is turned on pulls the gate (G) of the SCR switch Q3 to the level of the reference terminal GND. At this time, the SCR switch Q3 is off according to the characteristic of the SCR switch Q3. Therefore, the first N-MOS Q1 enters the off state. Because the second control signal b still keeps at the low level, the second N-MOS Q2 is off.

In the above descriptions, at time $t_2$ to $t_3$, both the first N-MOS Q1 and the second N-MOS Q2 are off, letting the first side of the transformer T2 be open-circuited. At this time, the voltage waveform ac obtained at the first side of the transformer T2 is at a zero potential.

Reference is made to FIG. 11 as well as FIG. 5 again. At time $t_3$ to $t_4$, the first control signal a still keeps at the high level, while the second control signal b rises from the low level to the high level. The second control signal b is transmitted to the gate of the second N-MOS Q2 via the second buffer circuit 36 to turn on the second N-MOS Q2. Because the first control signal a still keeps at the high level, the first N-MOS Q1 is still off.

At this time, the first N-MOS Q1 is off, while the second N-MOS Q2 is on. The DC voltage built across the two ends of the resonance capacitor C2 will be transmitted to the first side of the transformer T2 via the second N-MOS Q2 that is turned on. At this time, the voltage waveform ac obtained at the first side of the transformer T2 is a negative DC power −Vcc, and forms a negative half cycle of driving.

Reference is made to FIG. 11 as well as FIG. 5 again. At time $t_4$ to $t_5$, the first control signal a still keeps at the high level, and the second control signal b drops from the high level to the low level. At this time, both the first N-MOS Q1 and the second N-MOS Q2 are off, letting the first side of the transformer T2 be open-circuited. The voltage waveform ac obtained at the first side of the transformer T2 is at a zero potential.

Reference is made to FIG. 11 as well as FIG. 5 again. In the present invention, the circuit actions of the half bridge inverter with dual N-MOS and the voltage waveform ac obtained at the first side of the transformer T2 at time $t_5$ to $t_6$ repeat those at time $t_1$ to $t_2$. In this way, an AC power for providing energy is formed. At the same time, the transformer T2 boosts the AC power and then provides energy for the load from the second side.

Figure 6:
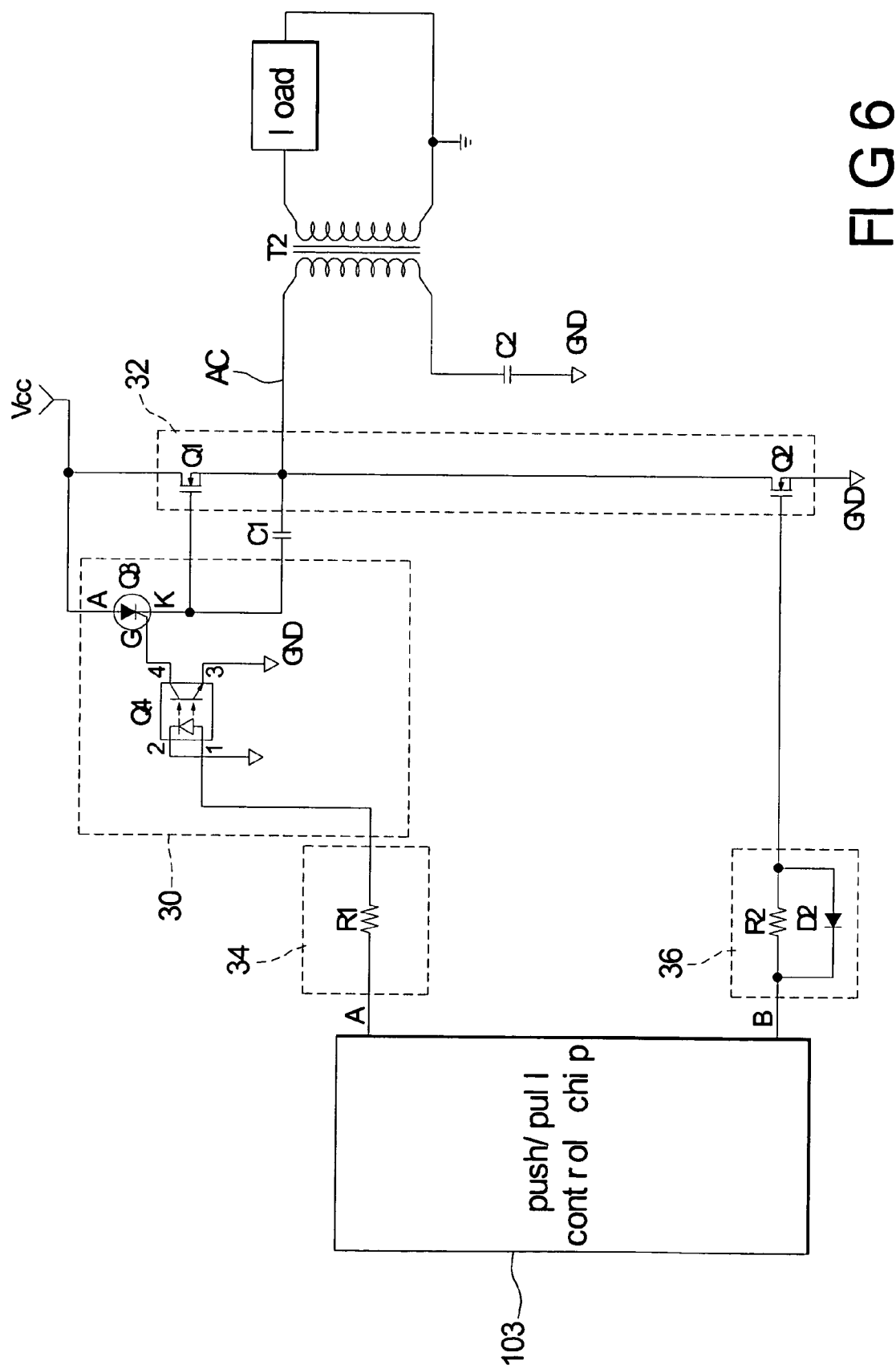
FIG. 6 is a circuit diagram of the half bridge inverter with dual N-MOS according to a second embodiment of the present invention.

Reference is made to FIG. 6 as well as FIG. 5. In this second embodiment, components identical to those used in the first embodiment are labeled with the same symbols. The circuit actions and achieved effects of this second embodiment are the same as those of the first embodiment. This second embodiment differs from the first embodiment only in that the switch Q4 in the first embodiment is replaced with a light-coupled switch to protect the circuit components in the half bridge inverter with dual N-MOS through the characteristic of the light-coupled switch, and the first accelerating diode D1 of the first buffer circuit 34 has been taken.

Figure 7:
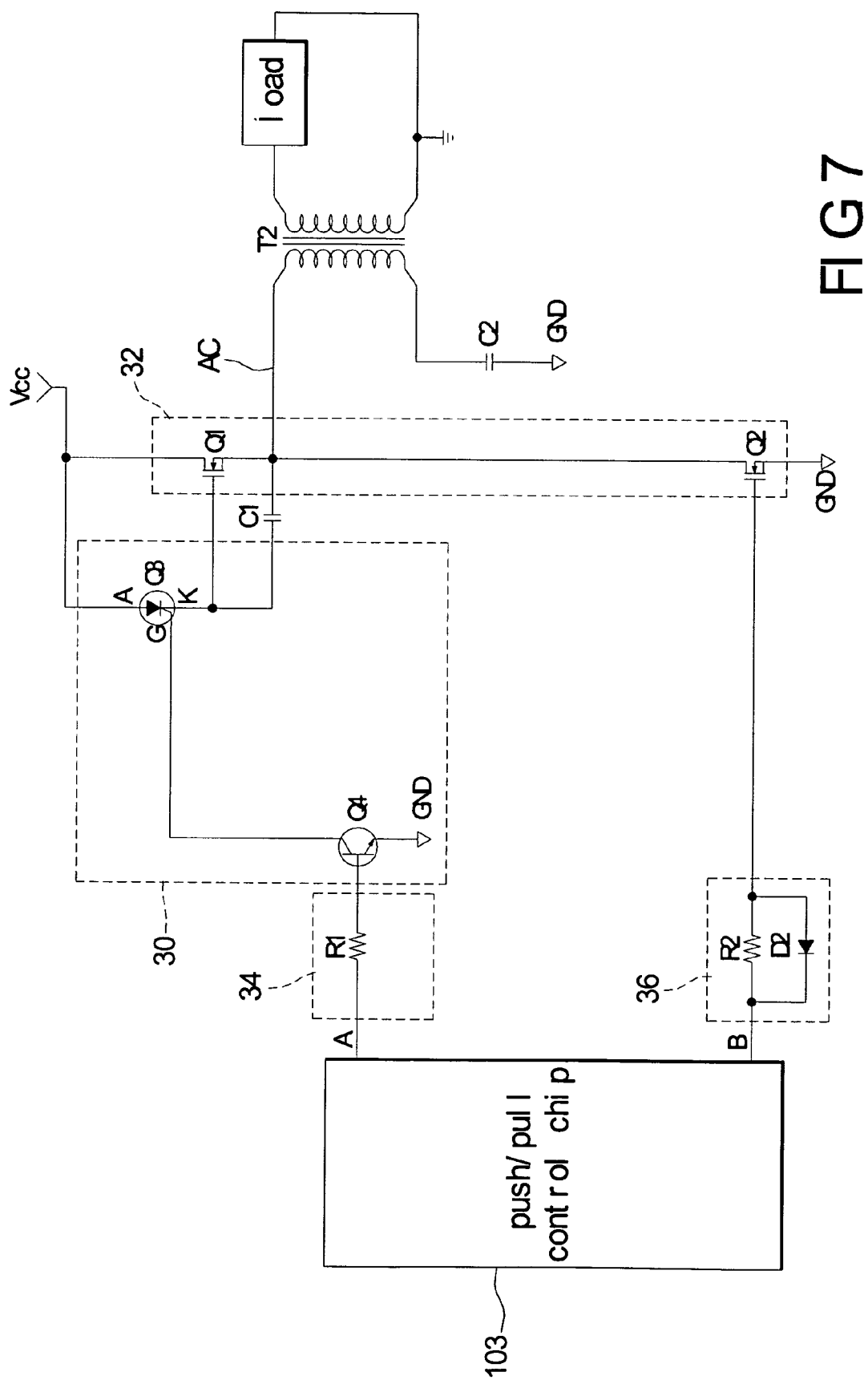
FIG. 7 is a circuit diagram of the half bridge inverter with dual N-MOS according to a third embodiment of the present invention.

Reference is made to FIG. 7 as well as FIG. 5. In this third embodiment, components identical to those used in the first embodiment are labeled with the same symbols. The circuit actions and achieved effects of this third embodiment are the same as those of the first embodiment. This third embodiment differs from the first embodiment only in that the switch Q4 in the first embodiment is replaced with a bipolar transistor switch BJT, and the first accelerating diode D1 of the first buffer circuit 34 has been taken.

Figure 8:
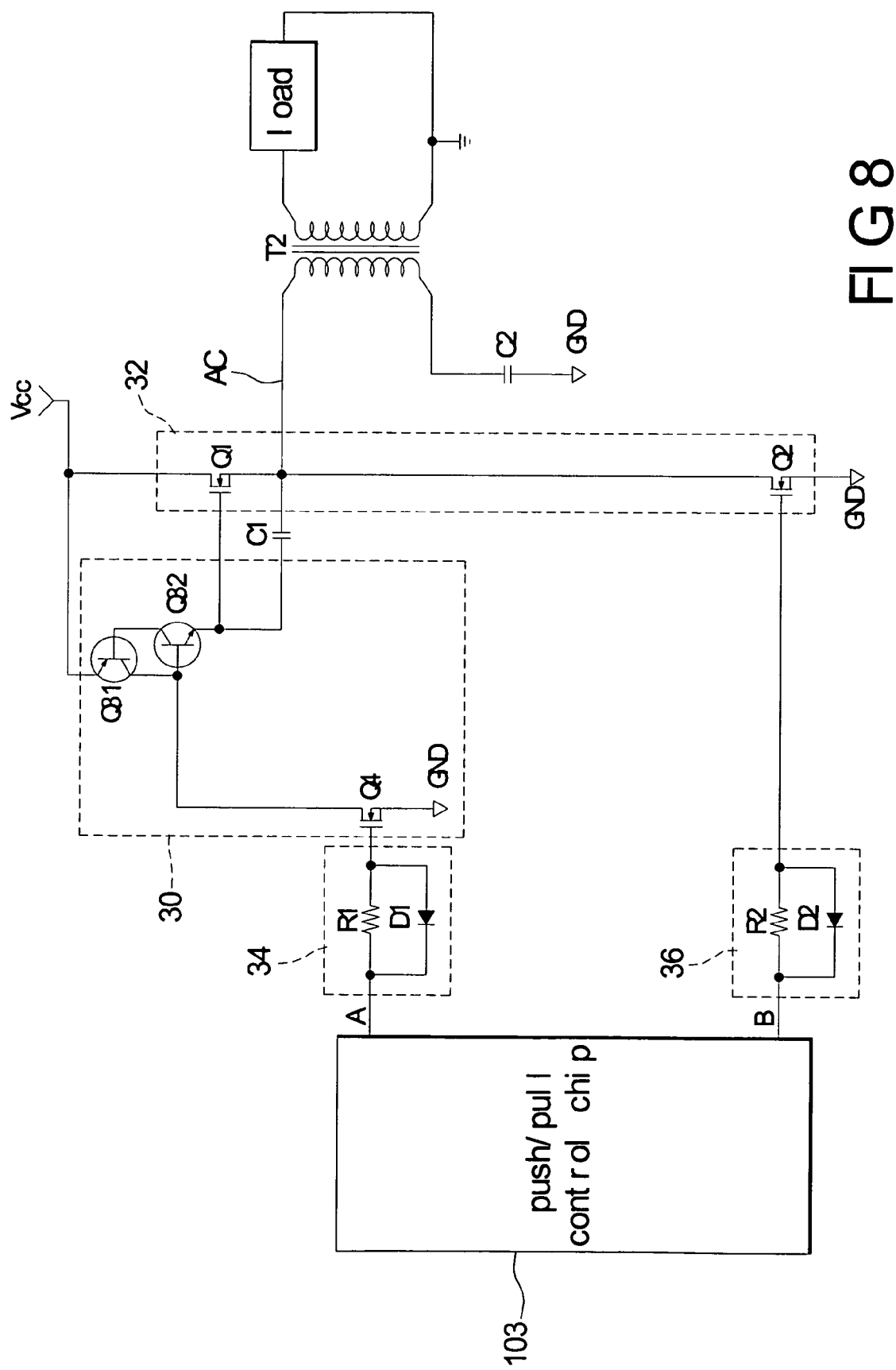
FIG. 8 is a circuit diagram of the half bridge inverter with dual N-MOS according to a fourth embodiment of the present invention.

Reference is made to FIG. 8 as well as FIG. 5. In this fourth embodiment, components identical to those used in the first embodiment are labeled with the same symbols. The circuit actions and achieved effects of this fourth embodiment are the same as those of the first embodiment. This fourth embodiment differs from the first embodiment as follows: the SCR switch Q3 in the first embodiment is effectively replaced with a pnp transistor Q31 and an npn transistor Q32 that are coupled together.

Figure 9:
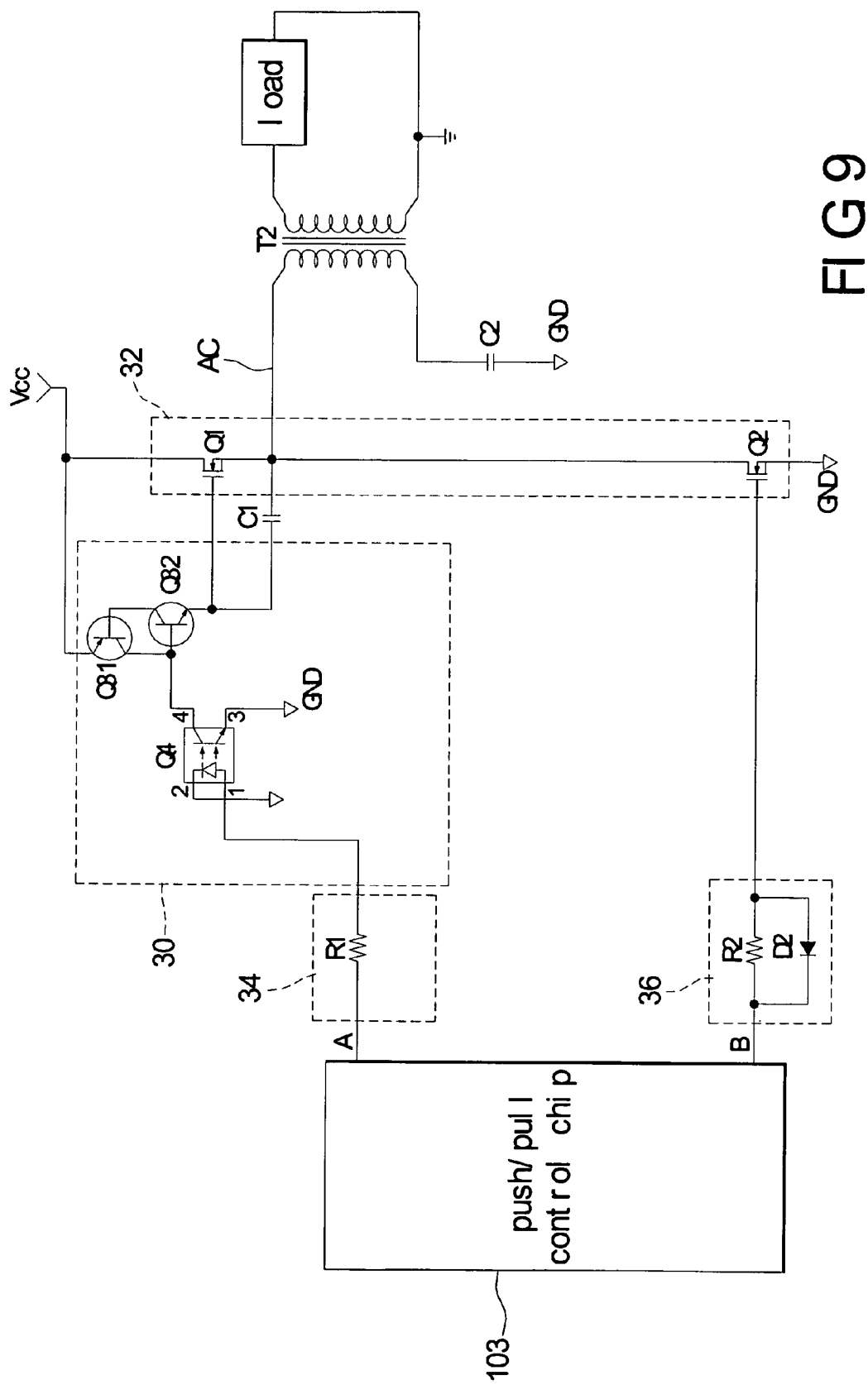
FIG. 9 is a circuit diagram of the half bridge inverter with dual N-MOS according to a fifth embodiment of the present invention.

Reference is made to FIG. 9 as well as FIG. 5. In this fifth embodiment, components identical to those used in the first embodiment are labeled with the same symbols. The circuit actions and achieved effects of this fifth embodiment are the same as those of the first embodiment. This fifth embodiment differs from the first embodiment only in that the switch Q4 in the first embodiment is replaced with a light-coupled switch, and the first accelerating diode D1 of the first buffer circuit 34 has been taken. Moreover, the SCR switch Q3 in the first embodiment is effectively replaced with a pnp transistor Q31 and an npn transistor Q32 that are coupled together.

Figure 10:
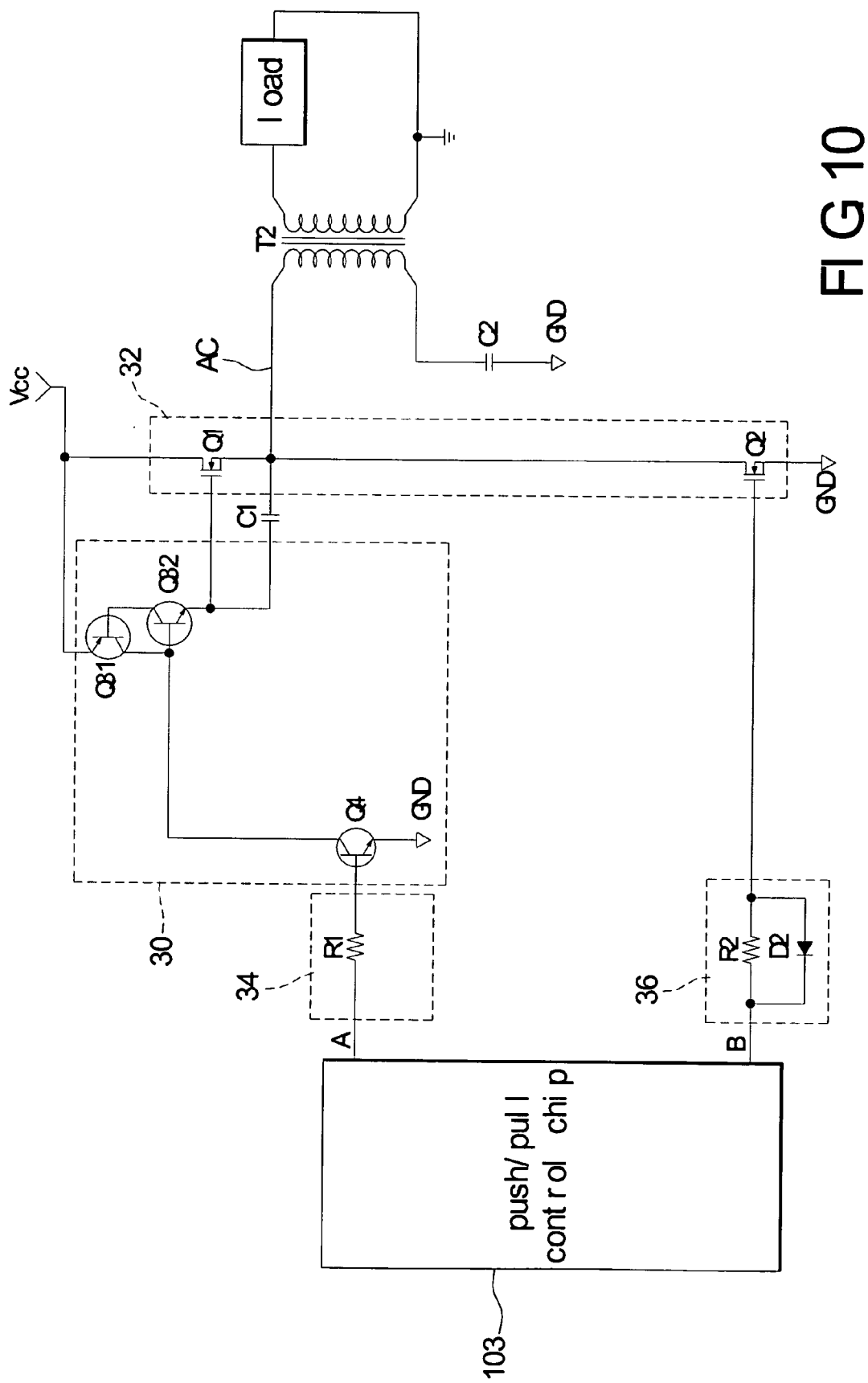
FIG. 10 is a circuit diagram of the half bridge inverter with dual N-MOS according to a sixth embodiment of the present invention.

Reference is made to FIG. 10 as well as FIG. 5. In this sixth embodiment, components identical to those used in the first embodiment are labeled with the same symbols. The circuit actions and achieved effects of this sixth embodiment are the same as those of the first embodiment. This sixth embodiment differs from the first embodiment only in that the switch Q4 in the first embodiment is replaced with a bipolar transistor switch BJT, and the first accelerating diode D1 of the first buffer circuit 34 has been taken. Moreover, the SCR switch Q3 in the first embodiment is effectively replaced with a pnp transistor Q31 and an npn transistor Q32 that are coupled together.

To sum up, the half bridge inverter with dual N-MOS of the present invention can connect the driver 30 to the conventional half bridge inverter circuit to match the push/pull control chip 103 outputting the first control signal with a duty cycle greater than 50% and the second control signal with a duty cycle smaller than 50% for control, hence having higher flexibility in practical use and being not limited by the control chip. Moreover, manufacturers only need to use the push/pull control chip 103 to drive and control a push/pull inverter circuit or a half bridge inverter circuit.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A half bridge inverter connected to a first side of a transformer and converting a DC power to an AC power, said half bridge inverter with dual N-MOS comprising:
    a push/pull control chip having a first output terminal and a second output terminal, said first output terminal outputting a first control signal with a duty cycle greater than 50%, and said second output terminal outputting a second control signal with a duty cycle smaller than 50%;
    a switch coupling to a reference terminal and said first output terminal of said push/pull control chip;
    an SCR switch having a gate coupling to said switch and an anode coupling to said DC power;
    a first N-MOS having a gate coupling to a cathode of said SCR switch and a drain coupling to said DC power and a source coupling to said first side of said transformer; and
    a second N-MOS having a gate coupling to said second output terminal of said push/pull control chip and a drain coupling to said source of said first N-MOS and a source coupling to said reference terminal.

2. The half bridge inverter as claimed in claim 1, wherein said DC power provides a positive DC power through conduction of said first N-MOS for said transformer to form a positive half-cycle of driving.

3. The half bridge inverter as claimed in claim 1 further comprising a resonance capacitor, wherein said resonance capacitor couples to said first side of said transformer.

4. The half bridge inverter as claimed in claim 3, wherein said resonance capacitor provides a negative DC power through conduction of said second N-MOS for said transformer to form a negative half-cycle of driving.

5. The half bridge inverter as claimed in claim 1, wherein said switch couples to said first output terminal of said push/pull control chip via a current limiting resistor.

6. The half bridge inverter as claimed in claim 5, wherein said switch is a bipolar transistor switch or a light-coupled switch.

7. The half bridge inverter as claimed in claim 1 further comprising a first buffer circuit, wherein said first buffer circuit comprises:
    a first accelerating diode having a negative (N) terminal coupling to said first output terminal of said push/pull control chip and a positive (P) terminal coupling to said switch; and
    a first resistor parallel coupling to said first accelerating diode.

8. The half bridge inverter as claimed in claim 1 further comprising a second buffer circuit, wherein said second buffer circuit comprises:
    a second accelerating diode having a negative (N) terminal coupling to said second output terminal of said push/pull control chip and a positive (P) terminal coupling to said gate of said second N-MOS; and
    a second resistor parallel coupling to said second accelerating diode.

9. The half bridge inverter as claimed in claim 1 further comprising a capacitor, wherein said capacitor is coupled between said gate and said source of said first N-MOS.

10. The half bridge inverter as claimed in claim 1, wherein said SCR switch is effectively formed by coupling a pnp transistor and an npn transistor.

11. A half bridge inverter connected to a first side of a transformer and converting a DC power to an AC power, said half bridge inverter with dual N-MOS comprising:
    a push/pull control chip having a first output terminal and a second output terminal, said first output terminal outputting a first control signal with a duty cycle greater than 50%, and said second output terminal outputting a second control signal with a duty cycle smaller than 50%;
    a first buffer circuit coupling to said first output terminal of said push/pull control chip;
    a second buffer circuit coupling to said second output terminal of said push/pull control chip;
    a driver coupling to said first output terminal of said push/pull control chip via said first buffer circuit and said DC power, and receiving said first control signal, said driver including (a) a switch coupled to said first buffer circuit and a reference terminal, and (b) an SCR switch having a gate coupled to said switch and an anode coupled to said DC power and a cathode coupled to said half bridge switch assemble, said driver; and
    a half bridge switch assembly composed of two N-MOSes, said half bridge switch assembly coupling to said DC power, said driver, said second buffer circuit and said transformer, and converting said DC power into an AC power by said driver, and said AC power being transmitted to a first side of said transformer.

12. The half bridge inverter as claimed in claim 11 further comprising a resonance capacitor, wherein said resonance capacitor couples to said first side of said transformer.

13. The half bridge inverter as claimed in claim 11, wherein said SCR switch is effectively formed by coupling a pnp transistor and an npn transistor.

14. The half bridge inverter as claimed in claim 11, wherein said switch is a MOS switch, a bipolar transistor switch or a light-coupled switch.

15. The half bridge inverter as claimed in claim 11 further comprising a capacitor, wherein said capacitor is coupled between said gate and said source of said first N-MOS.

* * * * *